United States Patent
Lee et al.

(10) Patent No.: US 7,093,189 B2
(45) Date of Patent: Aug. 15, 2006

(54) METHOD AND DEVICE FOR PERFORMING SOFT DECISION DECODING ON REED-MULLER CODES USING DECISION BY MAJORITY

(75) Inventors: Sang-Hyun Lee, Busan (KR); Kwang-Soon Kim, Daejeon (KR); Kyung-Hi Chang, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 440 days.

(21) Appl. No.: 10/334,352

(22) Filed: Dec. 31, 2002

(65) Prior Publication Data

US 2004/0103361 A1    May 27, 2004

(30) Foreign Application Priority Data

Nov. 21, 2002   (KR) .................. 10-2002-0072641

(51) Int. Cl.
*H03M 13/00*    (2006.01)
*H03M 13/03*    (2006.01)
(52) U.S. Cl. ................. 714/797; 714/780; 714/781
(58) Field of Classification Search ........... 714/797, 714/780, 781
See application file for complete search history.

(56) References Cited

FOREIGN PATENT DOCUMENTS

| | | |
|---|---|---|
| EP | 1143624 | 10/2001 |
| JP | 2001-345713 | 12/2001 |
| KR | 1020010019917 | 3/2001 |
| KR | 1020020067677 | 8/2002 |

OTHER PUBLICATIONS

Stephen B. Wicker, Error Control Systems for Digital Communication and Storage, Prentice-Hall, 1996, pp. 154-173.*

* cited by examiner

*Primary Examiner*—Joseph D. Torres
(74) *Attorney, Agent, or Firm*—Blakely Sokoloff Taylor & Zafman (57) ABSTRACT

An RM code soft decision decoding method using decision by majority comprises: (a) performing multiplication on a bit group of a codeword, and calculating an information bit's estimate group; (b) summating elements of the group and obtaining a final estimate of the degree's information bit to perform decision by majority; (c) using the final estimate to generate a codeword corresponding to each degree's information bit final estimate, and removing the generated codeword from the codeword of (a); (d) repeating the step (c) for the final estimates of the remaining degrees' information bits other than zero-order information bit; and (e) summating elements of codewords of results performed on the final estimates of the first-order information bit in (d) to estimate the zero-order information bit's final estimate.

10 Claims, 2 Drawing Sheets

METHOD AND DEVICE FOR PERFORMING SOFT DECISION DECODING ON REED-MULLER CODES USING DECISION BY MAJORITY

BACKGROUND OF THE INVENTION (a) Field of the Invention

The present invention relates to a method for decoding channel codes. More specifically, the present invention relates to a method and device for receiving data coded with RM (Reed-Muller) codes through a channel having continuous output values, and decoding the data through a soft decision decoding method using a decision by majority.

(b) Description of the Related Art

In 1954, Muller initially described the RM codes using binary functions, and in the same year, Reed found that the RM codes are expressed as multinomials of a binary field. This important feature makes it possible to decode the original codes using the decision by majority.

The RM codes are more flexible in that they may control a number of errors per codeword as opposed to the existing Hamming codes and the Golay codes, and hence they have been used to various applications. For example, 32-bit first-order RM codes were applied to the communication system of the spaceship Mariner launched in 1969, and the RM codes became a theoretical basis for various channel codes because of combinational and mathematical features provided by the definition of the RM codes.

However, the RM codes were not applied to the spaceship Pioneer since convolutional codes and sequential decoding were discovered, and they lost popularity since it was found that the BCH codes and the Reed Solomon codes outperform the RM codes.

As it has been found that short or first-order RM codes have a minimum length that is identical with that of the BCH codes and they have a very fast maximum likelihood decoding method that is not found in the BCH codes, data transmission rates have been newly applied to fields that require high-speed coding and decoding from the fields that have almost reached their technical limits.

The maximum likelihood fast decoding method found from the RM codes was proposed by Reed, and it is accordingly referred to as the Reed decoding method. The Reed decoding method is a method for correcting and decoding a plurality of errors by using a set of codewords generating equations of the RM codes, that is, it uses decision by majority which is the simplest decoding format. In the case of general codes, the decision by majority is known to be fast but suboptimal, but it is also found to be the maximum likelihood decoding method for the RM codes.

The decision by majority uses estimates of information bits encoded by an encoder from the codewords to be decoded. At least one estimate of the respective information bits may be calculated from the codeword-generating equations. Since many candidates are provided for an identical information bit, the decision by majority is performed on them, and a value of the corresponding bit is determined using the values of 0 or 1 more frequently provided.

Since the codeword-generating equation of the RM codes is defined to be product and sum of regular and simple codes known as the Hadamard codes, the format of the codeword-generating equation is very regular. Hence, a method for obtaining estimates of the information bits from the set of equations is also regular, and when a method for calculating a single estimate candidate is provided, other estimate candidates may be calculated by performing the same calculation on the bits corresponding to an index obtained by adding a predetermined number to a bit index of the codeword used for the first candidate, thereby enabling high-speed decoding.

The Reed decoding method is a maximum likelihood decoding method for high-speed decoding as described above, but since an area for defining calculation related to the decoding method is a binary field, and decoding inputs received through a channel have continuous values, the continuous values are to be converted into binary numbers of 0 and 1 so as to perform the calculation defined in the binary field. In this process, a hard decision for determining corresponding numbers according to codes of the decoder inputs is performed.

A binary field calculation is then performed on the received codeword on which the hard decision is performed to thereby obtain each bit's estimate candidate. The number of respective estimate candidates is determined according to a degree of the RM codes, and the more degrees the RM codes have, the more the number of the estimate candidates increases. The obtained candidates have one of the values 0 and 1, and the corresponding bit is decoded to the value that has more candidates.

The Reed decoding method requires previous performance of a hard decision since it calculates the binary field when obtaining information bit estimates for decision by majority. That is, since the value of the corresponding codeword bit is determined only through input codes of a decoder, the decision according to the input codes of the decoder in the case of a channel with low reliability of the input values of the decoder generates errors for each codeword bit. This reduces the decoder's decoding performance to lower total error correction performance. Also, it is unavoidable that bit errors may be generated with a high probability of ½ when the number of the candidates of decision by majority is even and both values of 0 and 1 have received the same number of votes, and accordingly, codeword patterns that may not be decodable may exist.

A prior art discloses an RM encoding and decoding method for decoding reliability of the codeword configured according to encoding by perforation and zero padding to thereby be applied to variable-length codewords, but it also requires a hard decision on the inputs, thereby failing to solve the above-noted problem.

SUMMARY OF THE INVENTION

It is an object of the present invention to provide a method and device for performing soft decision and decoding on RM codes using decision by majority for receiving RM-code decoder inputs from a channel without performing hard decision, and using continuous values to the decoding.

In one aspect of the present invention, in a method for using a codeword-generating matrix, receiving an codeword RM (Reed-Muller)-coded into a multinomial of a binary field through a channel having continuous output values, and using decision by majority to perform soft decision decoding, an RM code soft decision decoding method using decision by majority comprises: (a) performing a multiplication operation on a predetermined bit group of the codeword received through the channel, and calculating an estimate group of an information bit matched with each degree; (b) summing elements of the information bit estimate group and obtaining a final estimate of the information bit of the corresponding degree so as to perform decision by majority on the elements of the information bit estimate group calculated in (a); (c) using the final estimate of the information bit of each degree obtained in (b) to generate a codeword corresponding to an information bit final estimate of each degree, and removing the generated codeword from the codeword received in (a); (d) repeating the step (c) for the final estimates of the information bits of remaining degrees other than zero-order information bit from among the final estimates of the information bits of the respective degrees; and (e) summating elements of codewords of results performed on the final estimates of the first-order information bit in (d) to estimate a final estimate of the zero-order information bit.

The codeword received through the channel is a codeword of a second-order monomial, and final estimates of the second-order and first-order information bits are respectively obtained after performing the steps (a) and (b).

In (c), the second-order information bit's final estimate and the codeword-generating matrix are used to generate a corresponding codeword, a predetermined operation is performed on the generated codeword and the codeword received in (a), and the codeword encoded by the second-order information bit is removed from the received codeword to apply corresponding results to the first-order information bit.

The first-order information bit's final estimate and the codeword-generating matrix are used to generate a corresponding codeword, a predetermined operation is performed on the generated codeword and the received codeword that remains after performing the step (c) to remove the codeword encoded by the first-order information bit from the received codeword, and the remaining received codeword after the removal is used to calculate an estimate of a zero-order information bit.

The method further comprises after the step (e): using the final decision values of the information bits of the respective degrees obtained in the steps (c), (d), and (e) to calculate reliabilities of the respective information bits, and outputting soft decision values according to the reliabilities.

In another aspect of the present invention, in a device for using a codeword-generating matrix, receiving an codeword RM (Reed-Muller)-coded into a multinomial of a binary field through a channel having continuous output values, and using decision by majority to perform soft decision decoding, an RM code soft decision decoding device using decision by majority comprises: an information estimator for performing a multiplication operation on a predetermined bit group of continuous codewords received through the channel to calculate an estimate group of information bits matched with each degree; an estimate summator for summating elements of the information bit estimate value group and generating a final decision value of the corresponding degree's information bit so as to perform decision by majority on information bits of each degree estimated by the information estimator; and a codeword decoder for using the final decision value of the respective degrees' information bits generated by the estimate summator to decode the codeword input through the channel.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

The present invention may be applied to block codes encoded through all types of RM codes, and it will be described in detail by exemplifying the codes encoded to (32,16) second-order RM codes (referred to as RM(2,5) hereinafter).

Also, in order to easily describe the method for performing soft decision and decoding the RM codes according to a preferred embodiment of the present invention, a general method for performing hard decision and decoding the RM codes will now be described.

Figure 1:
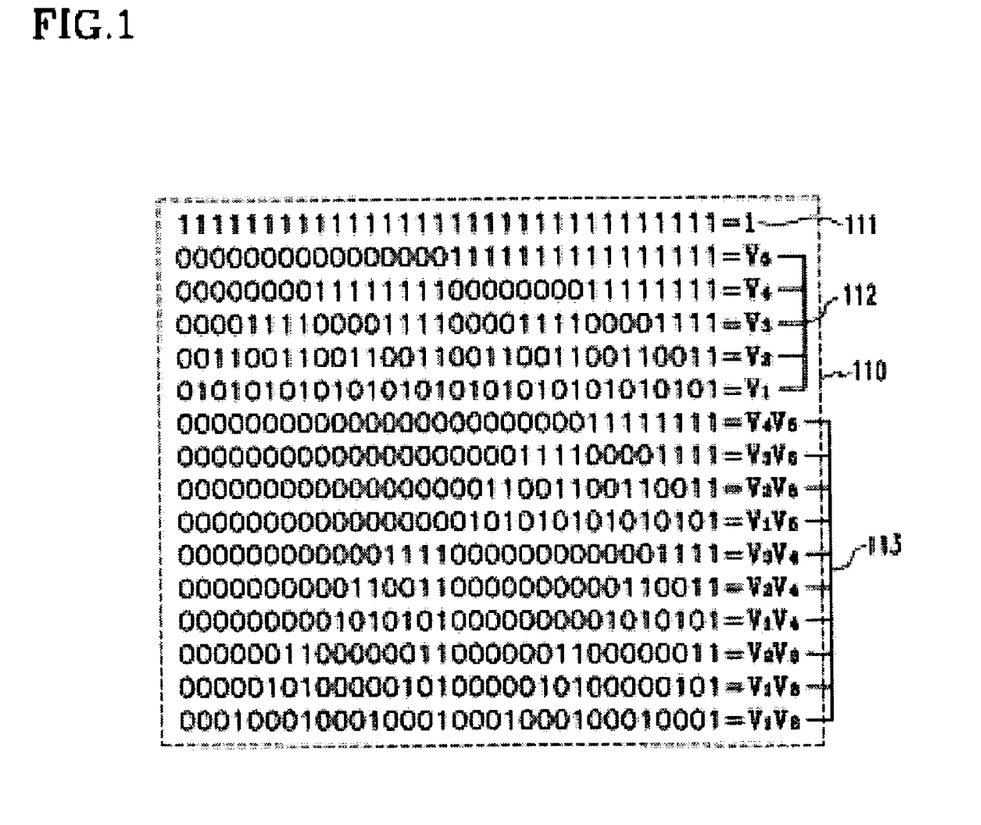
FIG. 1 shows a matrix of a codeword generation equation of RM(2,5)

FIG. 1 shows a matrix of a codeword generation equation of the RM(2,5) codes.

As shown, a block code for channel encoding has a codeword generation matrix for codeword generation. This codeword generation matrix 110 of second-order RM codes includes: a vector 111 that has values of all components as '1'; $2^{nd}$, $4^{th}$, $8^{th}$, and through $2^{N-th}$ row vectors 112 of the Hadamard matrix; and vectors 113 each of which is generated by the product of two different row vectors.

The codeword generation matrix 110 is expressed in Equation 1:

$$G = \begin{bmatrix} 1 \\ \overline{v_5} \\ \vdots \\ v_1 \\ \overline{v_4 v_5} \\ \vdots \\ v_1 v_2 \end{bmatrix} = \begin{bmatrix} G_1 \\ \overline{G_2} \\ \overline{G_3} \end{bmatrix} \qquad \text{Equation 1}$$

G generates the codeword c as expressed in Equation 3 through a binary field matrix calculation with the 16-bit information source vector m defined in Equation 2.

$$m = (m_0, m_5, m_4, m_3, m_2, m_1, m_{45}, \ldots, m_{12}) \qquad \text{Equation 2}$$

$$\begin{aligned} c &= (c_0, c_1, \ldots, c_{31}) \qquad \text{Equation 3} \\ &= m_0 1 + m_5 v_5 + \ldots + m_1 v_1 + m_{45} v_{45} + \ldots + m_{12} v_{12} \\ &= [m_0 \mid m_1 \mid m_2] \begin{bmatrix} G_0 \\ \overline{G_1} \\ \overline{G_2} \end{bmatrix} \end{aligned}$$

where $m_0$ represents an information bit multiplied by the vector 111 having all the component values as 1, $m_1$ denotes an information bit multiplied by the $2^{rd}$, $4^{th}$, $8^{th}$, and through $2^{N-th}$ row vectors 112 of the Hadamard matrix, and $m_2$ indicates an information bit multiplied by the vectors 113 generated by the product of two different vectors.

Figure 2:
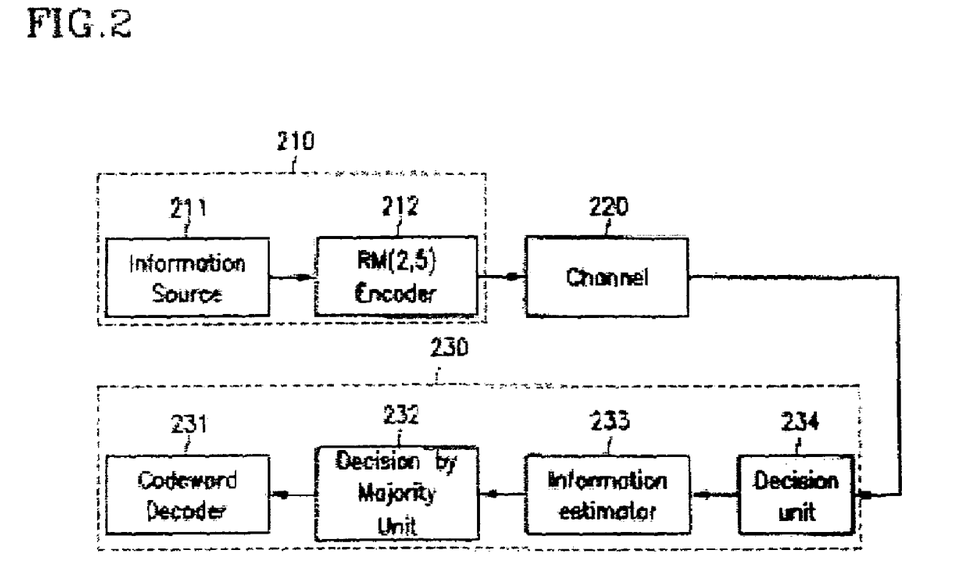
FIG. 2 shows a general block diagram of a decoder proposed by Reed.

FIG. 2 shows a general decoder block diagram proposed by Reed.

As shown, the Reed-proposed decoder comprises an encoder unit 210 connected via a channel 220, and a decoder unit 230.

In this instance, the encoder unit 210 comprises an information source 211 for generating information bits, and an encoder 212 for encoding the information bits generated by the information source 211 into codewords.

The codewords encoded by the encoder 212 are distorted when passing through the channel 220.

The decoder unit 230 comprises: a decision unit 234 for performing hard decision on the codeword input through the channel 220; an information estimator 233 for calculating an information estimate through the codeword decided by the decision unit 234; a decision by majority unit 232 for performing decision by majority on the information estimated by the information estimator 233; and a decoder 231 for using the information obtained through the decision by majority performed by the decision by majority unit 232 to decode the codeword.

Initial outputs c of the encoder 212 are given as 0 and 1 in the binary symmetric channel, and they are converted into 1 and −1 in the general channel 220 by using Equation 4.

$$c' = (-1)^c, c \in \{0,1\} \qquad \text{Equation 4}$$

Since the inputs provided to the decision unit 234 through the channel 220 have continuous values, the decision unit 234 decides the inputs to be 0 and 1 so as to perform binary field calculation.

In this instance, the decision unit 234 decides a positive input to be 0 and a negative input to be 1 from Equation 4. The codeword generated by deciding the bits of the codeword through this method is defined to be r.

The Reed method for decoding the codeword r that is received and a hard decision is performed on it starts to decode the codeword from the highest-order information bit $m_2$.

To show a basic example of the Reed decoding method, a method for encoding first four bits of the codeword is expressed in Equation 5.

$$c_0 = m_0$$

$$c_1 = m_0 + m_1$$

$$c_2 = m_0 + m_2$$

$$c_3 = m_0 + m_1 + m_2 + m_{12} \qquad \text{Equation 5}$$

Equation 6 is obtained by summing the four codeword bits expressed in Equation 4.

$$\begin{aligned} c_0 + c_1 + c_2 + c_3 &= (m_0) + (m_0 + m_1) + (m_0 + m_2) + \\ & \quad (m_0 + m_1 + m_2 + m_{12}) \\ &= (m_0 + m_0 + m_0 + m_0) + (m_1 + m_1) + \\ & \quad (m_2 + m_2) + (m_{12}) \\ &= m_{12} \end{aligned} \qquad \text{Equation 6}$$

In the like manner, summation of subsequent four bits of the codeword is expressed in Equation 7.

$$\begin{aligned} c_4 + c_5 + c_6 + c_7 &= (m_0 + m_3) + (m_0 + m_1 + m_3 + m_{13}) + \\ & \quad (m_0 + m_2 + m_3 + m_{23}) + \\ & \quad (m_0 + m_1 + m_2 + m_3 + m_{23} + m_{13} + m_{12}) \\ &= (m_0 + m_0 + m_0 + m_0) + (m_1 + m_1) + \\ & \quad (m_2 + m_2) + (m_3 + m_3 + m_3 + m_3) + \\ & \quad (m_{13} + m_{13}) \\ &= m_{12} \end{aligned} \qquad \text{Equation 7}$$

Eight estimates of $m_{12}$ may be calculated according to the above-noted method. Eight estimates are found using Equation 8.

$$\begin{cases} m_{12} = c_0 + c_1 + c_2 + c_3 \\ m_{12} = c_4 + c_5 + c_6 + c_7 \\ m_{12} = c_8 + c_9 + c_{10} + c_{11} \\ m_{12} = c_{12} + c_{13} + c_{14} + c_{15} \\ m_{12} = c_{16} + c_{17} + c_{18} + c_{19} \\ m_{12} = c_{20} + c_{21} + c_{22} + c_{23} \\ m_{12} = c_{24} + c_{25} + c_{26} + c_{27} \\ m_{12} = c_{28} + c_{29} + c_{30} + c_{31} \end{cases} \qquad \text{Equation 8}$$

What is characteristic in Equation 8 is that the bits of the codeword are used once so as to obtain $m_{12}$. The above-noted method is applied to $m_2$, resulting in Equation 9.

$$\begin{cases} m_{12} = c_0 + c_1 + c_2 + c_3 \\ m_{12} = c_4 + c_5 + c_6 + c_7 \\ m_{12} = c_8 + c_9 + c_{10} + c_{11} \\ m_{12} = c_{12} + c_{13} + c_{14} + c_{15} \\ m_{12} = c_{16} + c_{17} + c_{18} + c_{19} \\ m_{12} = c_{20} + c_{21} + c_{22} + c_{23} \\ m_{12} = c_{24} + c_{25} + c_{26} + c_{27} \\ m_{12} = c_{28} + c_{29} + c_{30} + c_{31} \end{cases} \begin{cases} m_{13} = c_0 + c_1 + c_4 + c_5 \\ m_{13} = c_2 + c_3 + c_6 + c_7 \\ m_{13} = c_8 + c_9 + c_{12} + c_{13} \\ m_{13} = c_{10} + c_{11} + c_{14} + c_{15} \\ m_{13} = c_{16} + c_{17} + c_{20} + c_{21} \\ m_{13} = c_{18} + c_{19} + c_{22} + c_{23} \\ m_{13} = c_{24} + c_{25} + c_{28} + c_{29} \\ m_{13} = c_{26} + c_{27} + c_{30} + c_{31} \end{cases} \begin{cases} m_{23} = c_0 + c_2 + c_8 + c_{10} \\ m_{23} = c_1 + c_3 + c_9 + c_{11} \\ m_{23} = c_4 + c_6 + c_{12} + c_{14} \\ m_{23} = c_5 + c_7 + c_{13} + c_{15} \\ m_{23} = c_{16} + c_{18} + c_{24} + c_{26} \\ m_{23} = c_{17} + c_{19} + c_{25} + c_{27} \\ m_{23} = c_{20} + c_{22} + c_{28} + c_{30} \\ m_{23} = c_{21} + c_{23} + c_{29} + c_{31} \end{cases} \qquad \text{Equation 9}$$

$$\begin{cases} m_{14} = c_0 + c_2 + c_4 + c_6 \\ m_{14} = c_1 + c_3 + c_5 + c_7 \\ m_{14} = c_8 + c_{10} + c_{12} + c_{14} \\ m_{14} = c_9 + c_{11} + c_{13} + c_{15} \\ m_{14} = c_{16} + c_{18} + c_{20} + c_{22} \\ m_{14} = c_{17} + c_{19} + c_{21} + c_{23} \\ m_{14} = c_{24} + c_{26} + c_{28} + c_{30} \\ m_{14} = c_{25} + c_{27} + c_{29} + c_{31} \end{cases} \begin{cases} m_{24} = c_0 + c_4 + c_8 + c_{12} \\ m_{24} = c_1 + c_5 + c_9 + c_{13} \\ m_{24} = c_2 + c_6 + c_{10} + c_{14} \\ m_{24} = c_3 + c_7 + c_{11} + c_{15} \\ m_{24} = c_{16} + c_{20} + c_{24} + c_{28} \\ m_{24} = c_{17} + c_{21} + c_{25} + c_{29} \\ m_{24} = c_{18} + c_{22} + c_{26} + c_{30} \\ m_{24} = c_{19} + c_{23} + c_{27} + c_{31} \end{cases} \begin{cases} m_{34} = c_0 + c_2 + c_{16} + c_{18} \\ m_{34} = c_1 + c_3 + c_{17} + c_{19} \\ m_{34} = c_4 + c_6 + c_{20} + c_{22} \\ m_{34} = c_5 + c_7 + c_{21} + c_{23} \\ m_{34} = c_8 + c_{10} + c_{24} + c_{26} \\ m_{34} = c_9 + c_{11} + c_{25} + c_{27} \\ m_{34} = c_{12} + c_{14} + c_{28} + c_{30} \\ m_{34} = c_{13} + c_{15} + c_{29} + c_{31} \end{cases}$$

$$\begin{cases} m_{15} = c_0 + c_1 + c_8 + c_9 \\ m_{15} = c_2 + c_3 + c_{10} + c_{11} \\ m_{15} = c_4 + c_5 + c_{12} + c_{13} \\ m_{15} = c_6 + c_7 + c_{14} + c_{15} \\ m_{15} = c_{16} + c_{17} + c_{24} + c_{25} \\ m_{15} = c_{18} + c_{19} + c_{26} + c_{27} \\ m_{15} = c_{20} + c_{21} + c_{28} + c_{29} \\ m_{15} = c_{22} + c_{23} + c_{30} + c_{31} \end{cases} \begin{cases} m_{25} = c_0 + c_1 + c_{16} + c_{17} \\ m_{25} = c_2 + c_3 + c_{18} + c_{19} \\ m_{25} = c_4 + c_5 + c_{20} + c_{21} \\ m_{25} = c_6 + c_7 + c_{22} + c_{23} \\ m_{25} = c_8 + c_9 + c_{24} + c_{25} \\ m_{25} = c_{10} + c_{11} + c_{26} + c_{27} \\ m_{25} = c_{12} + c_{13} + c_{28} + c_{29} \\ m_{25} = c_{14} + c_{15} + c_{30} + c_{31} \end{cases} \begin{cases} m_{35} = c_0 + c_4 + c_{16} + c_{20} \\ m_{35} = c_1 + c_5 + c_{17} + c_{21} \\ m_{35} = c_2 + c_6 + c_{18} + c_{22} \\ m_{35} = c_3 + c_7 + c_{19} + c_{23} \\ m_{35} = c_8 + c_{12} + c_{24} + c_{28} \\ m_{35} = c_9 + c_{13} + c_{25} + c_{29} \\ m_{35} = c_{10} + c_{14} + c_{26} + c_{30} \\ m_{35} = c_{11} + c_{15} + c_{27} + c_{31} \end{cases}$$

$$\begin{cases} m_{45} = c_0 + c_8 + c_{16} + c_{24} \\ m_{45} = c_1 + c_9 + c_{17} + c_{25} \\ m_{45} = c_2 + c_{10} + c_{18} + c_{26} \\ m_{45} = c_3 + c_{11} + c_{19} + c_{27} \\ m_{45} = c_4 + c_{12} + c_{20} + c_{28} \\ m_{45} = c_5 + c_{13} + c_{21} + c_{29} \\ m_{45} = c_6 + c_{14} + c_{22} + c_{30} \\ m_{45} = c_7 + c_{15} + c_{23} + c_{31} \end{cases}$$

By using the above-described simultaneous equation, information bits corresponding to the codeword distorted on the channel 220 may be estimated. The received codeword r is expressed in the summation of the transmitted codeword c and an error pattern e of Equation 10.

$$r=(r_0,r_1,\ldots,r_{31})=(c_0,c_1,\ldots,c_{31})+(e_0,e_1,\ldots,e_{31}) \quad \text{Equation 10}$$

From the above, estimates of the information bits $\hat{m}_{12}^{(i)}$ may be calculated as expressed in Equation 11.

$$\hat{m}_{12}^{(1)}=r_0+r_1+r_2+r_3$$

$$\hat{m}_{12}^{(2)}=r_4+r_5+r_6+r_7$$

$$\hat{m}_{12}^{(3)}=r_8+r_9+r_{10}+r_{11}$$

$$\hat{m}_{12}^{(4)}=r_{12}+r_{13}+r_{14}+r_{15}$$

$$\hat{m}_{12}^{(5)}=r_{16}+r_{17}+r_{18}+r_{19}$$

$$\hat{m}_{12}^{(6)}=r_{20}+r_{21}+r_{22}+r_{23}$$

$$\hat{m}_{12}^{(7)}=r_{24}+r_{25}+r_{26}+r_{27}$$

$$\hat{m}_{12}^{(8)}=r_{28}+r_{29}+r_{30}+r_{31} \quad \text{Equation 11}$$

Decision by majority is performed so as to obtain a final estimate of the eight estimates of Equation 11. The decision by majority determines a corresponding information bit value with a greater amount, from among 0 and 1.

$$\hat{m}_{12}=\text{maj}\{\hat{m}_{12}^{(1)},\hat{m}_{12}^{(2)},\hat{m}_{12}^{(3)},\hat{m}_{12}^{(4)},\hat{m}_{12}^{(5)},\hat{m}_{12}^{(6)},\hat{m}_{12}^{(7)},\hat{m}_{12}^{(8)}\} \quad \text{Equation 12}$$

When applying the decision by majority to all equations of Equation 9, all values of the highest-order information bit $\hat{m}_2$ of the received codeword r may be obtained. After removing the obtained $\hat{m}_2$ from the codeword r as expressed in Equation 13, estimates of the subsequent highest-order information bit vector $m_1$ are calculated from the remaining codeword r'.

$$\hat{m}_2=(\hat{m}_{45},\hat{m}_{35},\hat{m}_{25},\hat{m}_{15},\hat{m}_{34},\hat{m}_{24},\hat{m}_{14},\hat{m}_{23},\hat{m}_{13},\hat{m}_{12}) \quad \text{Equation 13}$$

$$r'=r-\hat{m}_2G_2 \quad \text{Equation 13}$$

Sixteen equations of the first bit $m_1$ of $m_1$ are expressed in Equation 14.

$$\begin{cases} m_1 = c_0 + c_1 \\ m_1 = c_2 + c_3 \\ m_1 = c_4 + c_5 \\ m_1 = c_6 + c_7 \\ m_1 = c_8 + c_9 \\ m_1 = c_{10} + c_{11} \\ m_1 = c_{12} + c_{13} \\ m_1 = c_{14} + c_{15} \\ m_1 = c_{16} + c_{17} \\ m_1 = c_{18} + c_{19} \\ m_1 = c_{20} + c_{21} \\ m_1 = c_{22} + c_{23} \\ m_1 = c_{24} + c_{25} \\ m_1 = c_{26} + c_{27} \\ m_1 = c_{28} + c_{29} \\ m_1 = c_{30} + c_{31} \end{cases} \quad \text{Equation 14}$$

Simultaneous equations of all information bits of $m_1$ that may be calculated through the above-noted method are given in Equation 15.

$m_1 = c_{0+i_1} + c_{1+i_1}, i_1 \in \{0,2,4,6,8,10,12,14,16,18,20,22,24, 26,28,30\}$ $m_2 = c_{0+i_2} + c_{2+i_2}, i_2 \in \{0,1,4,5,8,9,12,13,16,17,20,21,24, 25,28,29\}$ $m_3 = c_{0+i_3} + c_{4+i_3}, i_3 \in \{0,1,2,3,8,9,10,11,16,17,18,19,24, 25,26,27\}$ $m_4 = c_{0+i_4} + c_{8+i_4}, i_4 \in \{0,1,2,3,4,5,6,7,16,17,18,19,20,21, 22,23\}$ $m_5 = c_{0+i_5} + c_{16+i_5}, i_5 \in \{0,1,2,3,4,5,6,7,8,9,10,11,12,13, 14,15\}$ Equation 15

Voting according to decision by majority expressed in Equation 16 is executed from the estimates of $m_1$ obtained from Equation 15 as shown in Equation 12.

$\hat{m}_1 = \text{maj}\{\hat{m}_1^{(1)}, \hat{m}_1^{(2)}, \hat{m}_1^{(3)}, \hat{m}_1^{(4)}, \hat{m}_1^{(5)}, \hat{m}_1^{(6)}, \hat{m}_1^{(7)}, \hat{m}_1^{(8)}, \hat{m}_1^{(9)}, \hat{m}_1^{(10)}, \hat{m}_1^{(11)}, \hat{m}_1^{(12)}, \hat{m}_1^{(13)}, \hat{m}_1^{(14)}, \hat{m}_1^{(15)}\}$ Equation 16.

When applying the decision by majority to all equations of Equation 15, all values of the first-order information bit $\hat{m}_1$ of the received codeword r may be found. When removing the $\hat{m}^1$ from the codeword r' using the method of Equation 17, estimates of zero-order information bits $m_0$ having all components as 1 are calculated through remaining codewords r".

$\hat{m}_1 = (\hat{m}_5, \hat{m}_4, \hat{m}_3, \hat{m}_2, \hat{m}_1)$ $r'' = r' - \hat{m}_1 G_1 = m_0 1 + e$ Equation 17

The equation of the final zero-order bit is given in the first one of Equation 18, and $\hat{m}_0$ is calculated using the second one of Equation 18.

$m_0 = c_i, i \in \{0,1,2,\ldots,30,31\}$ $\hat{m}_0 = \text{maj}\{r''_0, r''_1, \ldots, r''_{31}\}$ Equation 18

In the preferred embodiment of the present invention, a hard decision on the continuous values input from the channel is not performed, but a soft decision for using the input continuous values as they are is performed. In this instance, since it is impossible to perform a binary field calculation on the continuous values, the addition of the binary field is converted into multiplication of continuous values.

For this, when 0 is converted to 1, and 1 is converted to −1, the binary field addition is substituted with a multiplication of a new binary field having 1 and −1. The newly defined binary field is required to have two numbers in the like manner of the existing binary field configured with 0 and 1, but since the defined operation is multiplication, an execution of multiplying continuous values generates meaningful values.

The values obtained from multiplication of the continuous values have a sign identical with that of results of binary field multiplication using 1 and −1, they have probability variables that may vary according to channel environments, and their mean values are 1 and −1. Therefore, the values thus obtained may be deemed to be reliabilities of the respective estimate candidates.

Hence, when signs of the obtained values for decision by majority are taken, the obtained values generate performance identical with that of the existing Reed decoding method, and accordingly, the values of the candidates obtained by modifying the decision by majority are added, and values of the corresponding information bits of the obtained values are decided through their signs.

Through this method, when the number of assumption on 0 and 1 is the same, probability of errors that may be generated is substantially reduced because of determination according to respective estimates' reliabilities. Finally obtained soft decision values may be applied to subsequent processes to be executed after the decoder's process to thereby perform repetitive decoding.

In the preferred embodiment of the present invention, a performance-improved decoding method is provided by substituting the general Reed decoding method with the operation used by the Reed method through a binary field conversion according to Equation 4.

By performing binary field conversion according to Equation 4, an addition (+) of the initial GF(2) is defined to be product (°§) of numbers on a new binary field.

TABLE 1

| A | B | A + B | A | B | A° § B |
|---|---|-------|---|---|--------|
| 0 | 0 | 0 | 1 | 1 | 1 |
| 1 | 0 | 1 | −1 | 1 | −1 |
| 0 | 1 | 1 | 1 | −1 | −1 |
| 1 | 1 | 0 | −1 | −1 | 1 |

According to definitions of Table 1, equations of equation 8 may be redefined with respect to decoder inputs as shown in Equation 19.

$$\begin{cases} m'_{12} = c'_0 \cdot c'_1 \cdot c'_2 \cdot c'_3 \\ m'_{12} = c'_4 \cdot c'_5 \cdot c'_6 \cdot c'_7 \\ m'_{12} = c'_8 \cdot c'_9 \cdot c'_{10} \cdot c'_{11} \\ m'_{12} = c'_{12} \cdot c'_{13} \cdot c'_{14} \cdot c'_{15} \\ m'_{12} = c'_{16} \cdot c'_{17} \cdot c'_{18} \cdot c'_{19} \\ m'_{12} = c'_{20} \cdot c'_{21} \cdot c'_{22} \cdot c'_{23} \\ m'_{12} = c'_{24} \cdot c'_{25} \cdot c'_{26} \cdot c'_{27} \\ m'_{12} = c'_{28} \cdot c'_{29} \cdot c'_{30} \cdot c'_{31} \end{cases} \quad \text{Equation 19}$$

When the definitions of operation are modified as described above, continuous decoder input values may be received and calculated immediately, thereby obtaining Equation 20.

$$\begin{cases} m'_{12} = r_0 \cdot r_1 \cdot r_2 \cdot r_3 \\ m'_{12} = r_4 \cdot r_5 \cdot r_6 \cdot r_7 \\ m'_{12} = r_8 \cdot r_9 \cdot r_{10} \cdot r_{11} \\ m'_{12} = r_{12} \cdot r_{13} \cdot r_{14} \cdot r_{15} \\ m'_{12} = r_{16} \cdot r_{17} \cdot r_{18} \cdot r_{19} \\ m'_{12} = r_{20} \cdot r_{21} \cdot r_{22} \cdot r_{23} \\ m'_{12} = r_{24} \cdot r_{25} \cdot r_{26} \cdot r_{27} \\ m'_{12} = r_{28} \cdot r_{29} \cdot r_{30} \cdot r_{31} \end{cases}, r_i \in [-\infty, \infty], i \in \{0, 1, \ldots, 31\} \quad \text{Equation 20}$$

Applying the method of Equation 20 to all equations of Equation 9 results in soft decision estimates having continuous values of $\hat{m}_2'$.

It is required to perform decision by majority on the calculated soft decision estimates of $\hat{m}_2'$, but since the values of the estimates are different with the probability of 1, no decision by majority may be executed. Therefore, the decision by majority for soft decision estimates is newly defined as expressed in Equation 21.

$$\hat{m}'_{12} = maj\{\hat{m}'^{(1)}_{12}, \hat{m}'^{(2)}_{12}, \hat{m}'^{(3)}_{12}, \hat{m}'^{(4)}_{12}, \hat{m}'^{(5)}_{12}, \hat{m}'^{(6)}_{12}, \hat{m}'^{(7)}_{12}, \hat{m}'^{(8)}_{12}\} \quad \text{Equation 21}$$

$$\equiv \sum_{i=1}^{8} \hat{m}'^{(i)}_{12}$$

Final soft decision estimates are obtained from Equation 21, and when applying Equation 9 to Equation 20 in the like manner, final estimates of all bits of $\hat{m}_2'$ are obtained.

$$\hat{m}'_2 = \left( \sum_{i=1}^{8} \hat{m}'^{(i)}_{45}, \sum_{i=1}^{8} \hat{m}'^{(i)}_{35}, \sum_{i=1}^{8} \hat{m}'^{(i)}_{25}, \sum_{i=1}^{8} \hat{m}'^{(i)}_{15}, \sum_{i=1}^{8} \hat{m}'^{(i)}_{34}, \right.$$

$$\left. \sum_{i=1}^{8} \hat{m}'^{(i)}_{24}, \sum_{i=1}^{8} \hat{m}'^{(i)}_{14}, \sum_{i=1}^{8} \hat{m}'^{(i)}_{23}, \sum_{i=1}^{8} \hat{m}'^{(i)}_{13}, \sum_{i=1}^{8} \hat{m}'^{(i)}_{12} \right) \quad \text{Equation 22}$$

Two decoding methods are possible through the estimates obtained from Equation 22. The first method is to modify the definition of the operation so as to use the Reed decoding method. That is, the codeword corresponding to the estimated bit is removed from the Reed's decoding method as shown in Equation 13. A subtraction operation in GF(2) is identical with the addition operation. Therefore, the subtraction operation is performed through a relationship shown in Table 1.

Since it is required to reproduce a codeword from the estimated bit, the multiplication operation of GF(2) is to be redefined to an operation on a new binary field. For this, a new operation is defined in Equation 23.

$$sgn(x) \equiv \begin{cases} 1 & x > 0 \\ -1 & x < 0 \\ 0 & x = 0 \end{cases} \quad \text{Equation 23}$$

$$(-1)^0 \equiv 1$$

$$G_i \equiv [g^{(i)}_{j,k_i}], i \in \{0, 1, 2\}, j \in \{0, \ldots, 31\}$$

$$k_2 \in K_2 = \{45, 35, 25, 15, 34, 24, 14, 23, 13, 12\}$$

$$k_1 \in K_1 = \{5, 4, 3, 2, 1\}$$

$$k_0 \in K_0 = \{0\}$$

The operation of Equation 13 is redefined to be Equation 24 on the basis of the definitions of Equation 23.

$$\hat{m}'_2 = (\hat{m}'_{45}, \hat{m}'_{35}, \hat{m}'_{25}, \hat{m}'_{15}, \hat{m}'_{34}, \hat{m}'_{24}, \hat{m}'_{14}, \hat{m}'_{23}, \hat{m}'_{13}, \hat{m}'_{12}) \quad \text{Equation 24}$$

$$r'_i = r_i \cdot (-1)^{\left(\sum_{k_2 \in K_2} \frac{1}{2}(1-sgn(\hat{m}'_{k_2}))g^{(2)}_{i,k_2}\right)}, i \in \{0, 1, \ldots, 31\}$$

The codewords encoded by second-order information bits through Equation 24 are removed from the input codewords. Estimates on the first-order information bits are calculated as expressed in Equation 25 from the result r' of Equation 24. Equation 19 and Equation 20 are applied to Equation to thereby calculate $\hat{m}_i'^{(j)}$ $$\hat{m}'_2 \equiv (\hat{m}'_5, \hat{m}'_4, \hat{m}'_3, \hat{m}'_2, \hat{m}'_1) \quad \text{Equation 25}$$

$$= \left( \sum_{i=1}^{16} \hat{m}'^{(i)}_5, \sum_{i=1}^{16} \hat{m}'^{(i)}_4, \sum_{i=1}^{16} \hat{m}'^{(i)}_3, \sum_{i=1}^{16} \hat{m}'^{(i)}_2, \sum_{i=1}^{16} \hat{m}'^{(i)}_1 \right)$$

$$r''_i = r'_i \cdot (-1)^{\left(\sum_{k_1 \in K_1} \frac{1}{2}(1-sgn(\hat{m}'_{k_1}))g^{(1)}_{i,k_1}\right)}, i \in \{0, 1, \ldots, 31\}$$

Estimation of final zero-order information bit $\hat{m}_0'$ is performed with summation of all values of $r''_1$.

$$\hat{m}'_0 = \sum_{i=0}^{31} r''_i \quad \text{Equation 26}$$

The second decoding method uses the estimated soft decision value $\hat{m}'$ to generate a codeword to be removed, and removes the codeword from the received codeword. Therefore, an operation on the method for removing the codeword regenerated from the estimated information from the estimated information is to be defined differently from the method used in Equation 24 and Equation 25.

Equation 27 and Equation 28 express methods for respectively using a second-order information bit $\hat{m}_2'$ and a first-order information bit $\hat{m}_1'$ to perform a new decoding method. In this instance, an absolute value operation on a set represents a calculation of a number of elements of the set.

$$\hat{m}'_2 = (\hat{m}'_{45}, \hat{m}'_{35}, \hat{m}'_{25}, \hat{m}'_{15}, \hat{m}'_{34}, \hat{m}'_{24}, \hat{m}'_{14}, \hat{m}'_{23}, \hat{m}'_{13}, \hat{m}'_{12}) \quad \text{Equation 27}$$

$$r'_i = r_i \cdot \left( \prod_{k_2 \in K_2} \frac{m_{k_2}}{|K_2|}(2g^{(2)}_{i,k_2} - 1)^{\frac{1}{2}(1-sgn(m_{k_2}))} \right)^{\frac{1}{|K_2|}}, i \in \{0, 1, \ldots, 31\}$$

-continued $$\hat{m}'_1 = (\hat{m}'_5, \hat{m}'_4, \hat{m}'_3, \hat{m}'_2, \hat{m}'_1)$$ Equation 28

$$r'_i = r_i \cdot \left( \prod_{k_1 \in K_1} \frac{m_{k_1}}{|K_1|} (2g^{(1)}_{i,k_1} - 1)^{\frac{1}{2}(1-sgn(m_{k_1}))} \right)^{\frac{1}{|K_1|}}, i \in \{0, 1, \ldots, 31\}$$

The method of Equation 26 is used to estimate $\hat{m}_0'$.

A device for decoding RM codes through the above-described methods will be described with reference to FIG. 3.

Figure 3:
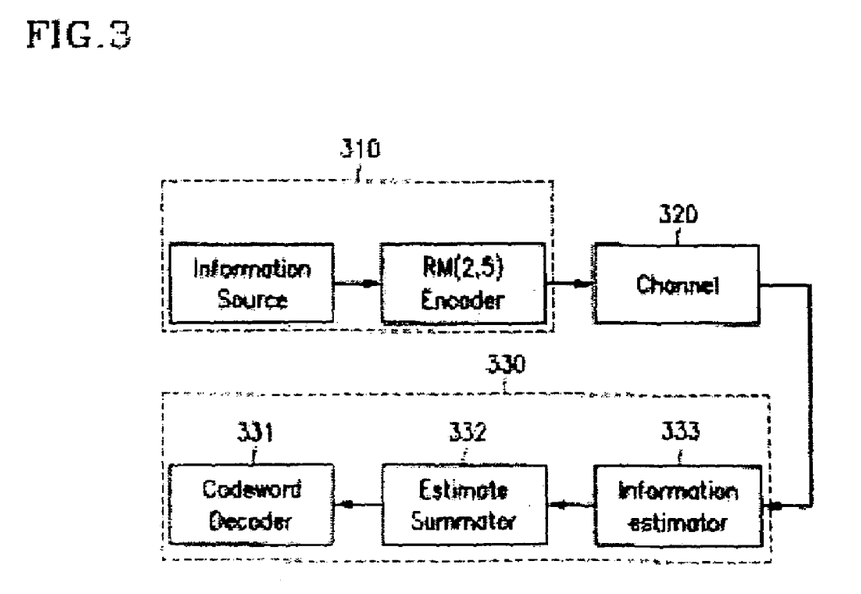
FIG. 3 shows a block diagram of a soft decision decoder of RM codes using decision by majority according to a preferred embodiment of the present invention.

FIG. 3 shows a block diagram of an RM-code soft decision decoder using decision by majority according to a preferred embodiment of the present invention.

A shown, the RM-code soft decision decoder comprises an encoder 310, and a decoder 330 connected to the encoder 310 through a channel 320.

Here, since the encoder 310 is matched with the encoder 210 of FIG. 2, no corresponding description will be provided.

The decoder 330 comprises an information estimator 333, an estimate summator 332, and a codeword decoder 331.

The information estimator 333 calculates estimates of second-order and first-order information bits related to Equation 20.

The estimate summator 332 uses estimates of second-order and first-order bits calculated by the information estimator 333 to calculate summation of estimates of the second-order and first-order information bits related to Equation 22.

The codeword decoder 331 applies Equations 24, 25, and 26 according to the first method to summation of the estimates calculated by the estimate summator 332, or applies Equations 26, 27, and 28 according to the second method to the summation to estimate a zero-order bit and decide total codewords and information bits.

Additionally, outputs of the codeword decoder 331 may be bit information through hard decision, but it is required for the codeword decoder 331 to provide soft decision outputs when it uses a channel encoding method such as repetitive decoding. Therefore, it is needed to calculate the reliability m" of respective information bits so as to generate soft decision outputs, and to achieve this, additional calculation of Equation 29 is performed on results of Equations 24 through 28.

$$m'' = \left[ \hat{m}_0 \left| \frac{\hat{m}_1}{|K_1|} \right| \frac{\hat{m}_2}{|K_2|} \right]$$ Equation 29

According to the present invention, since no hard decision is performed on the decoder inputs, but the codewords continuously input through a channel are directly decoded, signs (+, −) of the codewords received through the channel and values of the codeword inputs are used by the decoder, thereby preventing wrong decoding because of a plurality of bits with low reliability. That is, a function for performing decoding with not many bits of high reliability for decision by majority is added to the existing RM decoder.

Also, since a function for performing soft decision on all information bits as continuous values is provided, soft-decision performed values are provided as the decoder's outputs, reliability on the corresponding information bit is calculated, and accordingly, the reliability of the information bits may be transmitted to respective devices provided to the rear of the decoder. Hence, application of this method enables repetitive decoding. That is, soft decision outputs of the RM decoder are used for other decoder's probability of the corresponding information bit.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A method for decoding a continuous-valued Reed-Muller ("RM") encoded codeword using soft decision and decision by majority, comprising:
    (a) performing a multiplication operation on a predetermined bit group of the continuous-valued codeword received through the channel, and calculating an estimate group of an information bit matched with each degree;
    (b) summating elements of the information bit estimate group and obtaining a final estimate of the information bit of the corresponding degree so as to perform decision by majority on the elements of the information bit estimate group calculated in (a);
    (c) using the final estimate of the information bit of each degree obtained in (b) to generate a codeword corresponding to an information bit final estimate of each degree, and removing the generated codeword from the codeword received in (a);
    (d) repeating the step (c) for the final estimates of the information bits of remaining degrees other than zero-order information bits from among the final estimates of the information bits of the respective degrees; and
    (e) summating elements of codewords of results performed on the final estimates of the first-order information bit in (d) to estimate a final estimate of the zero-order information bit.

2. The method of claim 1, wherein the codeword received through the channel is a codeword of a second-order monomial, and final estimates of the second-order and first-order information bits are respectively obtained after performing the steps (a) and (b).

3. The method of claim 2, wherein in (c), the second-order information bit's final estimate and the codeword-generating matrix are used to generate a corresponding codeword, a predetermined operation is performed on the generated codeword and the codeword received in (a), and the codeword encoded by the second-order information bit is removed from the received codeword to apply corresponding results to the first-order information bit.

4. The method of claim 3, wherein the first-order information bit's final estimate and the codeword-generating matrix are used to generate a corresponding codeword, a predetermined operation is performed on the generated codeword and the received codeword that remains after performing the step (c) to remove the codeword encoded by the first-order information bit from the received codeword, and the remaining received codeword after the removal is used to calculate an estimate of a zero-order information bit.

5. The method of claim 4, wherein in (d), removal of the codeword corresponding to the final decision value of the first-order information bit from the codeword r' generated in (c) satisfied subsequent equations:

$$\hat{m}'_1 \equiv (\hat{m}'_5, \hat{m}'_4, \hat{m}'_3, \hat{m}'_2, \hat{m}'_1)$$

$$= \left( \sum_{i=1}^{16} \hat{m}'^{(i)}_5, \sum_{i=1}^{16} \hat{m}'^{(i)}_4, \sum_{i=1}^{16} \hat{m}'^{(i)}_3, \sum_{i=1}^{16} \hat{m}'^{(i)}_2, \sum_{i=1}^{16} \hat{m}'^{(i)}_1 \right)$$

$$r''_i = r'_i \cdot (-1)^{\left( \sum_{k_1 \in K_1} \frac{1}{2}(1-sgn(\hat{m}'_{k_1}))g^{(1)}_{i,k_1} \right)}, \ i \in \{0, 1, \ldots, 31\}$$

where $\hat{m}'_1$ represents a final decision value group of the first-order information bits, and r'' denotes a codeword when a codeword corresponding to the final decision value of the first-order information bit is removed from the codeword r'.

6. The method of claim 5, wherein the final decision value $\hat{m}'_2$ of the second-order information bit, the final decision value $\hat{m}'_1$ of the first-order information bit, and the final decision value $\hat{m}'_0$ of the zero-order information bit are used to calculate the corresponding information bits' reliabilities $\hat{m}''$ according to a subsequent equation $$m'' = \left[ \hat{m}_0 \left| \frac{\hat{m}_1}{|K_1|} \right| \frac{\hat{m}_2}{|K_2|} \right].$$

7. The method of claim 4, wherein in (d), removal of the codeword corresponding to the final decision value of the first-order information bit from the codeword r' generated in (c) satisfies subsequent equations:

$$\hat{m}'_1 \equiv (\hat{m}'_5, \hat{m}'_4, \hat{m}'_3, \hat{m}'_2, \hat{m}'_1)$$

$$r'_i = r_i \cdot \left( \prod_{k_1 \in K_1} \frac{m_{k_1}}{|K_1|} (2g^{(1)}_{i,k_1} - 1)^{\frac{1}{2}(1-sgn(m_{k_1}))} \right)^{\frac{1}{|K_1|}}, \ i \in \{0, 1, \ldots, 31\}$$

where $\hat{m}'_1$ represents a final decision value group of the first-order information bits, r'' shows a codeword when a codeword corresponding to the final decision value of the first-order information bit is removed from the codeword r', and the set $K_1$ denotes that $K_1=\{5, 4, 3, 2, 1\}$, and an absolute value operation on the set $K_1$ represents a calculation of a number of elements of the set.

8. The method of claim 3, wherein in (c), removal of the codeword corresponding to the final estimate of the second-order information bit from the codeword r received in (a) satisfies subsequent equations:

$$\hat{m}'_2 = (\hat{m}'_{45}, \hat{m}'_{35}, \hat{m}'_{25}, \hat{m}'_{15}, \hat{m}'_{34}, \hat{m}'_{24}, \hat{m}'_{14}, \hat{m}'_{23}, \hat{m}'_{13}, \hat{m}'_{12})$$

$$r'_i = r_i \cdot (-1)^{\left( \sum_{k_2 \in K_2} \frac{1}{2}(1-sgn(\hat{m}'_{k_2}))g^{(2)}_{i,k_2} \right)}, \ i \in \{0, 1, \ldots, 31\}$$

where $\hat{m}'_2$ represents a final decision value group of the second-order information bits, r' indicates a codeword when a codeword corresponding to the final decision value of the second-order information bit is removed from the code r, and $$sgn(x) \equiv \begin{cases} 1 & x > 0 \\ -1 & x < 0 \\ 0 & x = 0 \end{cases}$$

$(-1)^0 \equiv 1$ $G_i \equiv [g^{(i)}_{j,k_i}], i \in \{0,1,2\}, j \in \{0,K,31\}$
$k_2 \in K_2 = \{45,35,25,15,34,24,14,23,13,12\}$
$k_1 \in K_1 = \{5,4,3,2,1\}$
$k_0 \in K_0 = \{0\}$ 9. The method of claim 3, wherein in (c), removal of the codeword corresponding to the final decision value of the second-order information bit from the codeword r received in (a) satisfies subsequent equations:

$$\hat{m}'_2 = (\hat{m}'_{45}, \hat{m}'_{35}, \hat{m}'_{25}, \hat{m}'_{15}, \hat{m}'_{34}, \hat{m}'_{24}, \hat{m}'_{14}, \hat{m}'_{23}, \hat{m}'_{13}, \hat{m}'_{12})$$

$$r'_i = r_i \cdot \left( \prod_{k_2 \in K_2} \frac{m_{k_2}}{|K_2|} (2g^{(2)}_{i,k_2} - 1)^{\frac{1}{2}(1-sgn(m_{k_2}))} \right)^{\frac{1}{|K_2|}}, \ i \in \{0, 1, \ldots, 31\}$$

where $\hat{m}'_2$ represents a final decision value group of the second-order information bits, r' denotes a codeword when a codeword corresponding to the final decision value of the second-order information bit is removed from the codeword r, and the set $K_2$ shows that $K_2=\{45, 35, 25, 15, 34, 24, 14, 23, 13, 12\}$, and an absolute value operation on the set $K_2$ represents a calculation of a number of elements of the set.

10. The method of claim 1, wherein further comprising after the step (e): using the final decision values of the information bits of the respective degrees obtained in the steps (c), (d), and (e) to calculate reliabilities of the respective information bits, and outputting soft decision values according to the reliabilities.

* * * * *